(12) United States Patent
Argyle et al.

(10) Patent No.: US 6,593,739 B1
(45) Date of Patent: Jul. 15, 2003

(54) APPARATUS AND METHOD FOR MEASURING MAGNETIZATION OF SURFACES

(75) Inventors: Bernell Edwin Argyle, Hopewell Junction, NY (US); Jeffery Gregory McCord, San Jose, CA (US)

(73) Assignee: International Business Machines Corp., Armonk, NY (US)

( * ) Notice: Subject to any disclaimer, the term of this patent is extended or adjusted under 35 U.S.C. 154(b) by 17 days.

(21) Appl. No.: 09/876,621

(22) Filed: Jun. 7, 2001

Related U.S. Application Data
(60) Provisional application No. 60/211,027, filed on Jun. 12, 2000.

(51) Int. Cl.$^7$ .................. G01R 33/032; G01R 33/12
(52) U.S. Cl. ............... 324/244.1; 324/210; 324/244; 356/390; 359/68
(58) Field of Search ............... 324/96, 244, 244.1; 356/365, 390

(56) References Cited

U.S. PATENT DOCUMENTS

| | | | | |
|---|---|---|---|---|
| 4,755,752 A | * | 7/1988 | Fitzpatrick | 324/228 |
| 5,227,715 A | * | 7/1993 | Ito et al. | 324/96 |
| 5,382,901 A | * | 1/1995 | Okajima et al. | 324/244.1 |
| 5,477,376 A | * | 12/1995 | Iwatsuka et al. | 359/283 |
| 5,736,856 A | * | 4/1998 | Oliver et al. | 324/244.1 |
| 5,994,898 A | * | 11/1999 | DiMarzio et al. | 324/244.1 |
| 6,025,918 A | * | 2/2000 | Maris | 356/388 |
| 6,034,523 A | * | 3/2000 | Bosselmann et al. | 324/117 R |

OTHER PUBLICATIONS

Schäfer et al. "Domain Studies in Single Crystal Ferrite MIG Heads with Image–Enhanced, Wide–Field Kerr Microscopy," IEEE Transactions on Magnetics, vol. 28, No. 5 Sep. 1992 pp. 2644–2646.*

Trouilloud et al. "Methods for wide–field Kerr imaging of small magnetic devices," IEEE Transactions on Magnetics, vol. 30, No. 6, Nov. 1994 pp. 4494–4496.*

Silva et al. "Nonreciprocal differential detection method for scanning Kerr–effect microscopy," Journal of Applied Physics vol. 81, No. 8, Apr. 1997, pp. 5015–5017.*

Argyle et al. "New laser illumination method for Kerr microscopy," Journal of Applied Physics vol. 87, No. 9, May 1, 2000, pp. 6487–6489.*

* cited by examiner

*Primary Examiner*—Edward Lefkowitz
*Assistant Examiner*—Darrell Kinder
(74) *Attorney, Agent, or Firm*—Rodney T Hodgson

(57) ABSTRACT

An optical apparatus and methods for efficiently determining the magnetization of a material at very high optical resolution are disclosed. Individual components of the magnetization may be determined. Components in the plane of the sample surface are imaged by illuminating the material obliquely with substantially parallel light of relatively high power and very well controlled uniformity and polarization, and using light scattered obliquely in a parallel beam in the opposite direction at the same angle as the angle of incidence to record an image. Reversing the illumination and observation directions allows subtraction of the two images and measurement of the magnetization in-plane. A second in-plane component orthogonal to the first, is obtained similarly after reorienting the plane of incidence 90 degrees. The third magnetization component,—perpendicular to the sample surface—, may be obtained using illumination at both angles of incidence and subtracting two images, each recorded when a light-polarization angle of offset from extinction, is reversed. All three components may thereby be imaged without recourse to modulating the sample magnetization as in previous methods. Magnetically 'hard' as well as 'soft' materials are measurable by these methods.

36 Claims, 7 Drawing Sheets

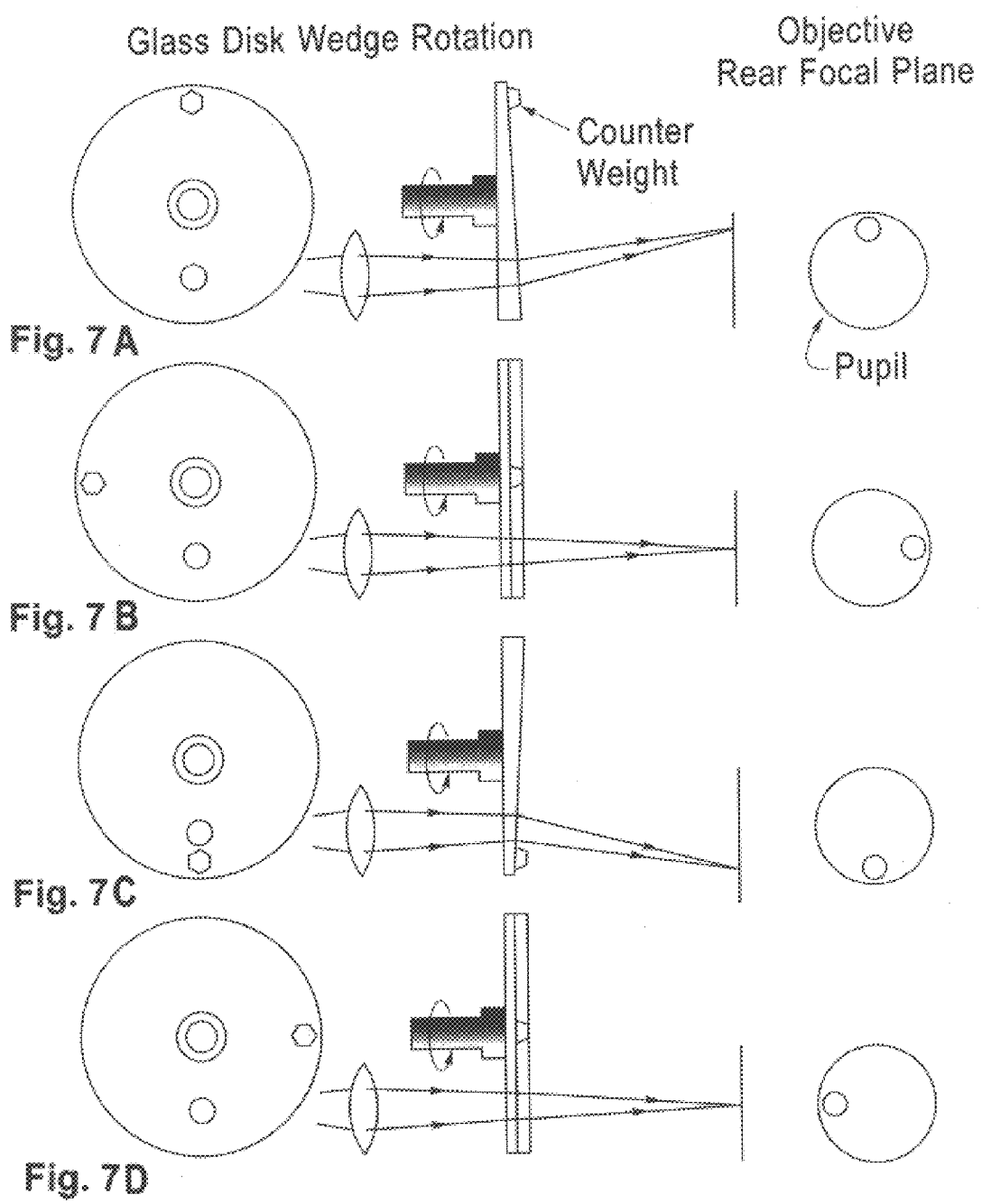

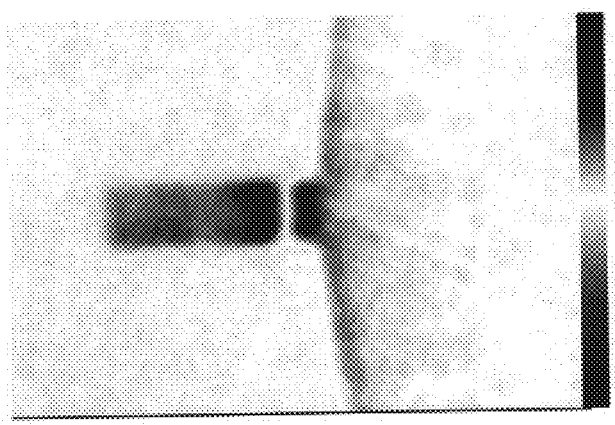
Fig. 13A
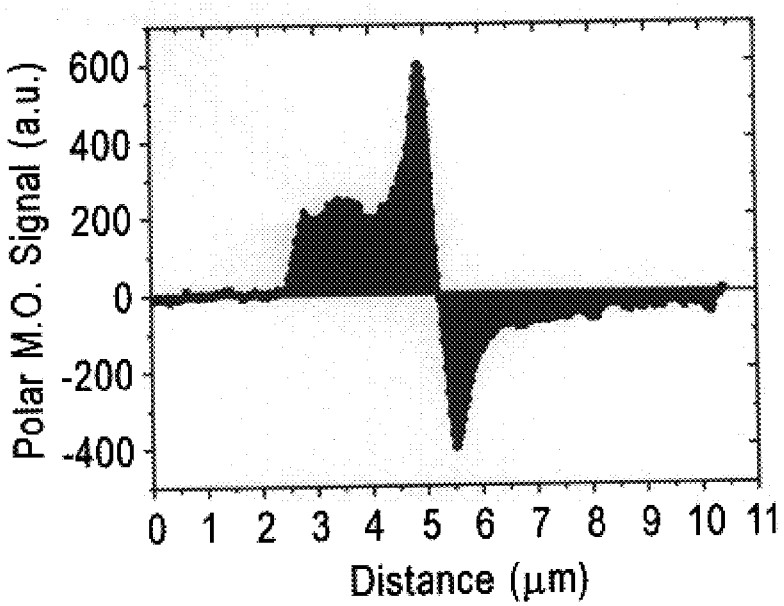
Fig. 13B
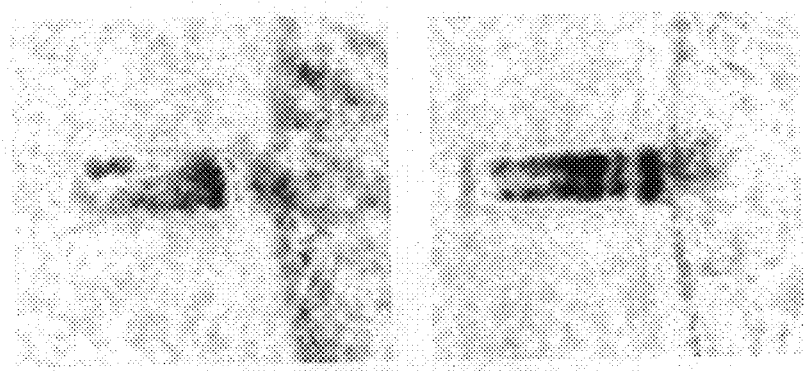
Fig. 14A   Fig. 14B

APPARATUS AND METHOD FOR MEASURING MAGNETIZATION OF SURFACES

CROSS REFERENCE TO RELATED APPLICATIONS

This application claims priority pursuant to 35 U.S.C. 119(e) to the U.S. Provisional Application No. 60/211,027, filed Jun. 12, 2000, all of the above applications and provisional applications being incorporated herein by reference in their entirety including incorporated material.

FIELD OF THE INVENTION

The field of the invention is the field of measuring the magnetization of the surface of an object by illuminating a broad area of the surface of the object with polarized light, and simultaneously imaging the surface at very high resolution with light scattered from the surface.

BACKGROUND OF THE INVENTION

Lasers have been be used as illumination sources for. Laser beams are typically single mode beams or multimode beams, and the beam homogeneity and coherence properties of such beams may not be sufficient for application like high resolution imaging of magnetic materials, where most of the light incident on the material is thrown away in polarization detection schemes. U.S. application Ser. No. 09/386,017, filed on Aug. 30, 1999 by the present authors, discloses in great detail apparatus and methods for homogenizing laser beams for microscopic and other applications.

An excellent overview of microscope illuminators is included in S. Inoue, Video Microscopy, Plenum Press, New York, N.Y., 1986.

Experimental images of surface magnetization abound in the literature (see, for example, Hubert, A. and Schaefer, R., 1998, Magnetic Domains, Springer, Berlin (Chapter 2)), as they describe in-plane or out-of-plane M-components, but rarely both. M-sensitive images have been obtained using light optics, electron optics, and scanning probe methods. Although limited in spatial resolution to order 100 nm, the magneto-optic Kerr-effect microscope is the most convenient and efficient method to obtain images. Advantages include little or no sample preparation requirements, capability to view through an overcoat film, response out to Larmour frequencies, and efficiency of data collection. Kerr microscopes are of two types. One method utilizing light focused on the sample, renders images with spot photodetection and mechanical rastering (see, for example, Re, M. and Kryder, M. J., 1984, J. Appl. Phys., vol.55,2245; Kasiraj, P., Horn, D. E. and Best, J. S., 1987, IEEE Trans. Magn. vol. MAG-23, 2161; Heyes, N. A. E., Wright, C. D. and Clegg, W. W., 1991, "Observation of magneto-optic phase contrast using a scanning laser microscope", J. Apl. Phys., col 68, 5322–5324). Another uses wide-field illumination, video detection and image processing. (see, for example, Frosch, A. and Schneider, J., 1980, IBM Tech. Discl. Bulletin, vol. 22,3260; Argyle, B. E. and Suits, F., 1985, "Laser magneto-optic microscope for studying domain motions in thin film heads (Invited)", Digest of 1985 INTERMAG Conf.; Schmidt, W., Rave, W. and Hubert, A. 1985, "Enhancement of magneto-optic domain observation by digital image processing", IEEE Trans. vol. MAG-21, 1596–1598). The prior art wide-field method of microscopy is illustrated schematically in FIG. 1, using large Hg-arc source 10. An offset aperture stop 12 produces oblique illumination 14. The inset 16 shows how, in a polarizing microscope, reducing aperture size confines illumination to a narrow region centered on one arm of the cross of extinction. The full aperture for conventional microscopy is stopped down for Kerr microscopy, as indicated in the inset.

OBJECTS OF THE INVENTION

It is an object of the invention to provide a method of measuring the magnetization of a material by illuminating the material with a light source of very carefully controlled uniformity, direction, and polarization, and imaging the material in a non-scanning system at very high resolution using light scattered from and within the surface of the material, and combining two or more high resolution images of the material to produce a high resolution image of a component of the magnetization of the material.

It is an object of the invention to produce high resolution images of at least two magnetic components of a material, wherein the relative positions of the material and the optical systems remain unchanged and wherein the magnetic field in the object remains unchanged.

SUMMARY OF THE INVENTION

The surface of the object is uniformly illuminated with a beam of substantially parallel polarized light incident on the surface at an angle $\vartheta_0$ to the normal to the surface wherein the plane of incidence is in the polarization cross. Light scattered from the surface and from below the surface of the object which leaves in a substantially parallel beam substantially in the plane of incidence but with an angle $\vartheta_0$ on the opposite side of the normal to the incident beam and which has polarization slightly different from the incident light is used to produce a first image the surface. Then, the illumination beam direction and the observation beam direction are exchanged, and a second image is produced. Subtraction of one image from the other produces a high resolution image of an in-plane component of the magnetization of the surface. This procedure may be repeated for a plane of incidence at 90° to the first, and the second in-plane component of the magnetization of the surface may be obtained. The polar component of the magnetization may be obtained by rotating the plane of polarization of the combining two images taken by rotating polarization of the incident light slightly.

BRIEF DESCRIPTION OF THE DRAWINGS

FIGS. 7a–d. Four positions of a rotating glass disk wedge (GDW) and the corresponding positions of source spots of illumination in the objective RFP.

FIG. 13. Pure polar Kerr-effect contrast of pole tips in a magneto-resistive recording head.

FIGS. 14a–b. Pure in-plane magnetic sensitivity perpendicular and parallel to tip axis with saturating current applied to head of FIG. 13.

DETAILED DESCRIPTION OF THE INVENTION

This application deals with an optical-wide-field microscopic approach with video detection, which is more convenient and less costly than mechanical scanning methods. To improve S/N ratios and remove background signals costs time with any approach. The unwanted duration depends in large part on the strength of the Kerr signals compared with background intensity and system noise. In materials comprising modern magnetic devices the Kerr contrast is typically very weak. Inspections or diagnostics of increasingly smaller recording heads used for recording higher bit density, would benefit from the highest optical magnification. Generally however, optical signals in reflection microscopes diminish with the fourth power of magnification, as shown in Inoue, S. and Spring, K. R., 1998, Video Microscopy, 2nd Edition, Plenum Press, New York. Kerr magneto-optic signals are indeed almost minuscule because of the condition of nearly crossed polarizers required in order to convert magneto-optic phase variations into an optical amplitude image. This condition discards most of the light provided by the source. To enhance signals buried in noise and to override the limitation of video detection threshold, a compromise must often be made. Reduce magnification to gain signal strength but suffer the diminished spatial resolution. Installing enhanced video detectors and an image processor may overcome such limitations but not without enduring lengthy processing times for A/D conversions, on-chip integration, frame accumulations (overriding noise), and digital image algebraics (removing background).

Figure 2:
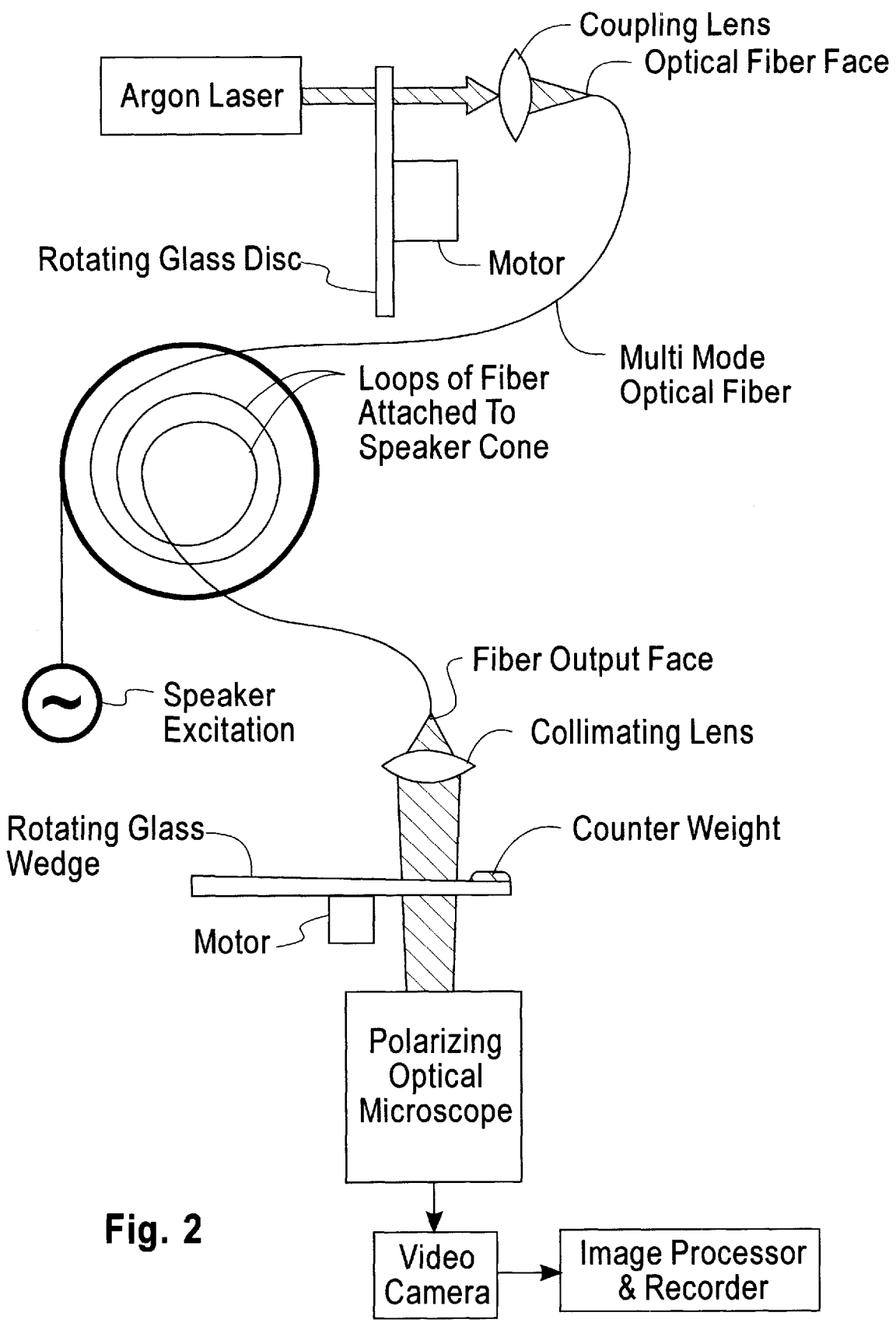
FIG. 2. System for speckle-free laser illumination.

In order to provide signal strengths many times greater than those resulting from using conventional light sources, we recently constructed an illumination system using a laser illuminated fiber, which is described in (Argyle, B. E. and McCord, J. G., 2000, "New laser illumination method for Kerr microscopy", J. Appl. Phys., vol. 87, 6487–6489). To avoid image artifacts such as 'speckle', it was necessary to modulate or 'dither' the fiber to reduce mode hopping and laser coherence. Generally, the most uniform, wide-field illumination on the object plane is provided by a point source focused in the objective's rear focal plane. However, even a coherent source focused to a point produces coherence at the object plane. A good compromise between a point source and a millimeter size Hg-arc, is to use a fiber having a core diameter between 100 to 200 microns; we use 200 mm. Three means for 'dithering' the fiber modes, discussed in detail in U.S. application Ser. No. 09/386,017, are schematically illustrated in FIG. 2. A collimating lens together with the polarizing microscope, focus an output-face image of a laser illuminated multimode fiber onto the rear focal plane (RFP) of the microscope objective. This image illuminates the object with a wide optic field. An Argon-ion laser and coupling lens illuminate the input face. A rotating glass disk made of unpolished Pyrex, a vibrating speaker cone with several fiber loops attached, and a rotating glass wedge, make the illumination speckle free.

Figure 3A:
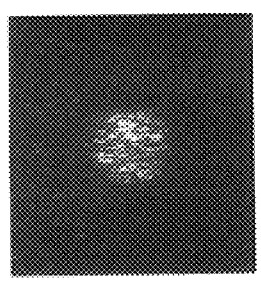
FIGS. 3a–d. Patterns of illumination on recording head pole tips from static and dithered laser light conducted through a multimode fiber.
Figure 3B:
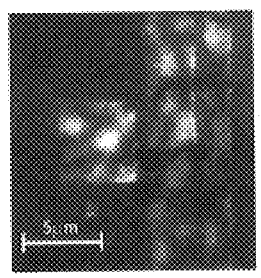
Figure 3C:
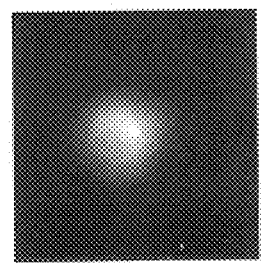
Figure 3D:
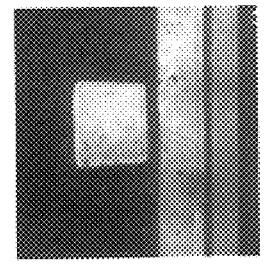
Figure 5A:
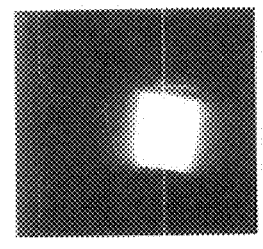
FIG. 5. Patterns observed with full aperture in the objective's rear focal plane (RFP) (conoscopic view) show asymmetry and unsteadiness of a Hg-arc source.
Figure 5B:
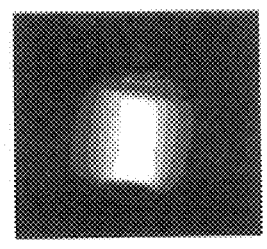
Figure 5C:
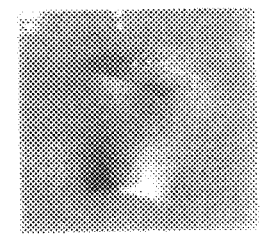
Figure 5D:
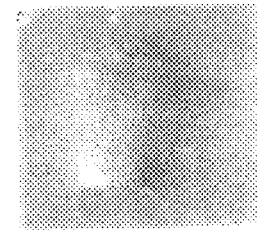

FIG. 3a shows the modes in the fiber in absence of the dithering. The resulting 'speckle' in the illumination on recording head pole tips is visible in FIG. 3b. Removal of mode delineation in the fiber face source and speckle in the illumination pattern as a result of applying the dithering, is evidenced in FIG. 3c and FIG. 3d. Images FIG. 3a and FIG. 3c are the fiber's output-face (conoscopic view) focused at the rear focal plane of the objective lens. Mottled illumination due to laser coherence and mode pattern (non dithered) is visible in FIG. 3c. The image taken with homogenized illumination in FIG. 3d results from dithering scheme of U.S. application Ser. No. 09/386,017. An approach similar to this may benefit microscopy of other types of weak phase objects, such as microbiological cells exhibiting phase variations due to their linear birefringence.

The spatial resolution possible with Kerr methods—both wide-field and focused laser—is limited fundamentally. Theoretical resolution for a 100×, 1.3 NA objective using 514 nm laser light for example, is $\lambda/2NA=200$ nm. Yet, we find using the higher intensity source, that object details at least 3 times smaller are perceivable.

In order to generate Kerr data efficiently and also allow computing all three components of the magnetization, we describe a method that can decompose the various types of Kerr-contrast and can render images having contrast due to pure in-plane or pure out-of-plane M-sensitivities. Previous discussions of in-plane and out-of-plane decomposition relied on theoretical models, see for example Yang, Z. J. And Sheinfein, M. R., 1993, "Combined three-axis surface magneto-optical Kerr effects in the study of surface and ultrathin-film magnetism", J. Appl. Phys. vol. 74, 6810–23., but the problem has largely been neglected experimentally due to difficulty of uniform illumination and imaging. The present invention produces images statically or in real time up to video frame times that are devoid of nonmagnetic optical background. This method is also be applicable to Kerr imaging by stroboscopically averaging time-resolved images accumulated from nanosecond or subnanosecond laser pulse exposures.

In contrast to earlier methods for removing background unrelated to magneto-optic contrast, our method does not require changing the sample's magnetic state in order to generate the featureless reference image for subtraction. The method works therefore, for both 'hard' and 'soft' materials or devices.

Theory of Regular Optical and Magneto-optical Kerr-effect Amplitudes.

Figure 4:
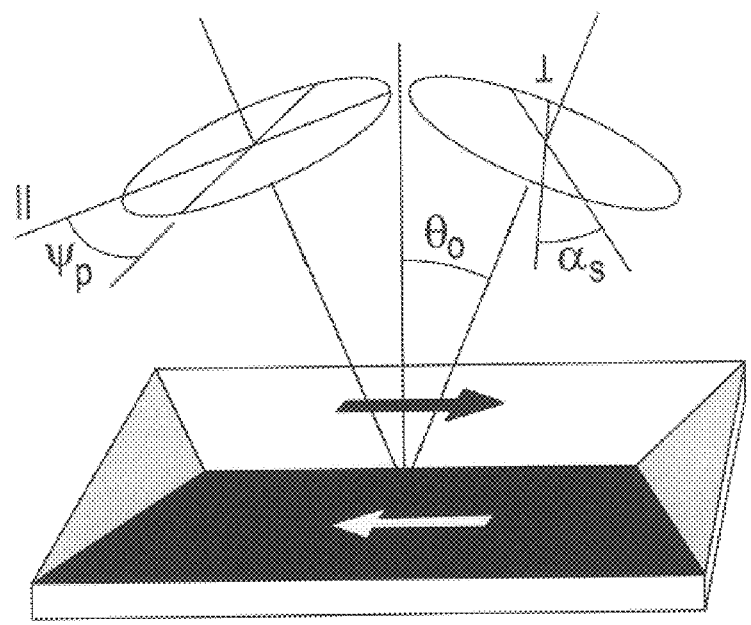
FIG. 4. Definitions of polarizer and analyzer offset angles, $\psi_p$ and $\alpha_s$, and the angle of incidence, $\vartheta_0$, in a magneto-optic Kerr-effect setup.

FIG. 4 describes a generalized Kerr effect geometry. The amplitudes of plane waves of light reflected from a magnetic surface have been expressed in terms of these angles, by $$A_{total} = -R_p \cos\psi_p \sin\alpha_s + R_s \sin\psi_p \cos\alpha_s + R_K^{polar}\cos(\alpha_s - \psi_p)m_{pol} + \quad (1)$$
$$R_K^{long}\cos(\alpha_s + \psi_p)m_{long} - R_K^{trans}\cos\psi_p \sin\alpha_s m_{trans}.$$

The first line presents the ordinary (nonmagnetic) reflection effect where $R_p$ and $R_s$ are ordinary reflection coefficients for the two polarizations parallel (p) and perpendicular (s) to the plane of incidence (POI), respectively. (These coefficients for regular reflection are derivable from Fresnel's formulae as they depend on a material's optical constants and angle-of- incidence of illumination.) The remaining terms include three Kerr magneto-optic effects separately expressed in terms that depend on the optical geometry and the three m-vector components, $m_{polar}$, perpendicular to the reflecting sample plane, and $m_{trans}$ and $m_{long}$, parallel to the sample plane and aligned transverse and parallel respectively, to the POI. Although not written explicitly, the Kerr amplitudes $\{R_K\}$ reverse sign if the angle of incidence, $\vartheta_0$, reverses sign (corresponds to reversing the direction of the light beam).

Kerr amplitudes, $R_K$, can be thought of as due to a small component of vibrational motion induced perpendicular to both the primary motion and the magnetization direction when light interacts with a material within its optical skin depth. This secondary motion is proportional to a Lorentz force ($\upsilon_L = -m \times E$) and generates, secondary light amplitudes, $R_K$. The Faraday amplitude that appears in light transmitted through the sample, is not treated here.

The transverse Kerr effect is connected to the in-plane magnetization aligned perpendicular to the POI, and produces an amplitude-only change upon reflection of incident light having its polarization parallel to the POI. No phase change occurs because the polarization direction is the same as the regularly reflected beam. A small amplitude change in the transverse Kerr effect produces minimal contrast in a visible reflected image. For perpendicular polarization, the transverse contrast is zero.

The longitudinal Kerr effect is sensitive to magnetization parallel to the POI and is the primary effect used in Kerr microscopy for detecting in-plane components.

The polar Kerr effect is independent of polarization orientation and is maximum when the light incidence is perpendicular to the sample, in which case the other Kerr contrasts are all zero. All three effects may be present for light at oblique incidence. A goal here is to separate these effects and generate images with contrast corresponding only to each one of the three M-components. We start by simplifying and removing the transverse Kerr sensitivity using the incident light polarized perpendicular to the POI.

The Kerr method we describe is sensitive because it uses our new, higher intensity, speckle-fee, CW ion-laser source to produce video signals many times greater than even the most intense regular source (100W Hg-arc). The ion laser is much steadier and has much longer lifetime than the Hg-arc (several $\times 10^4$ hours versus 100 hours).

FIGS. 5a–d shows patterns observed with full aperture in the objective's rear focal plane (RFP) (conoscopic view). Undesirable characteristics of a Hg-arc are typified in FIGS. 5a–d showing images of intensity distributions in line scan image of FIG. 5a and profiles FIG. 5b. Time- differential images in FIG. 5c and FIG. 5d made using digital frame-by-frame subtraction of sequential frames.

Figure 6A:
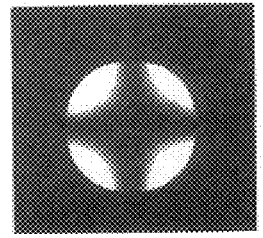
FIGS. 6a–b. Intensity in the objective's rear focal plane (RFP) when the polarizers are crossed for extinction in (a) and slightly uncrossed in (b).
Figure 6B:
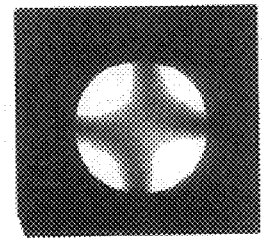

FIGS. 6a and 6b shows patterns of illumination imaged in the objective rear focal plane (RFP) the 'conoscopic view' when an object is smooth and the source is large and diffuse, and the polarizers are crossed for extinction in (6a), and slightly uncrossed in (6b). The source of illumination is a large Hg-arc and its intensity is dispersed over the objective's rear focal plane. The object is a featureless metallic surface.

The pattern in FIG. 6a obtained when the polarizers are crossed, is called the polarization "extinction cross". With reference to angle definitions in FIG. 4, this crossed condition has $\psi_p=0$ and as $\alpha_s 0$. In FIG. 6b they are slightly uncrossed ($\psi_p=0$, $\alpha_s>0$). The dark regions of "extinction" occur where light rays passing through the objective retain the same initial linear polarization. The brighter regions are due to refraction producing elliptically polarized light with rotated axes. Snell's Law dictates that optic planes intersecting an arc of the great circle of the lens' spherical surface, are the only rays that conduct through with the polarization unaltered. The cross orientation is defined by microscope bi-axes, which are established by a beam splitter inside, such as a semitransparent 45° mirror. The beam splitter is necessary for "epi-illumination" (through the objective lens) as is necessary for high-magnification microscopy. Experimentally, in the brightest region outside the extinction cross obtained using a 100×1.3 NA objective, i.e. near the pupil edge at 45° from the crossing arms, a rotation 2 orders larger than the maximum Kerr rotation from permalloy material occurs. Light rays entering the objective outside the cross of extinction, 'leak' a background light into the image. The leakage increases for ray bundles having increased dispersion in their angle of incidence. So, in order to diminish leakage and consequent distortion in the image contrast that can result from such dispersion, the size of the light source for Kerr microscopy must be small and/or apertured down. A 3.1 $\mu$m single-mode fiber is insufficient for wide-field imaging; its damage threshold (80 mW) is too low to permit the intensities needed Also, the more pointed the source, the more coherent is the illumination. A good compromise is a multimode fiber with 200 $\mu$ diameter.

In addition to background due to leakage outside the extinction cross, other sources include leakage due to imperfect polarizers with non-zero extinction ratios, phase changes due to strained microscope optics, and reflections within the microscope. It is helpful if a high quality polarizing microscope is available. Up to now, developing Kerr contrast in weak phase objects like permalloy, has usually relied on the indirect process of producing a difference image calculated between a reference image and an image of the magnetization state under investigation. If the reference image is smooth, the subtraction removes nonmagnetic background always present in the 'raw' image. A difficulty occurs however, when the sample has sharp edges physically, or is made of a magnetically 'hard' material. Extraordinarily large fields may be necessary then to overcome demagnetizing effects or large coercive fields in order to produce a smooth (saturated) reference state.

To overcome system noise including arc source instability, electronic noise, etc., each image stored in a digital memory for subsequent subtraction, is usually formed using multiple-frame accumulation. Another reference state sometimes used, is one representing time-averaged <M>=0 everywhere. Such a state may be generated by applying suitable AC fields and time-averaging with multiply-accumulated video frames. The variable AC fields randomly modulate or 'stir' the magnetization distribution; the video multi-frame accumulation process averages all states to zero, but only if the states being developed are sufficiently chaotic. Sometimes, a smaller (differential) change in magnetic state is of interest. This can be imaged with frame subtraction applied while a small, quasi-steady applied field is slightly changed. All three of these earlier methods are, however, incapable of separating polar and longitudinal Kerr contrast when oblique illumination is used. They can however, be used to image in real time at video rate, or to image pseudodynamically (at higher than video rate) changes in magnetic states resulting from high frequency- or pulsed magnetic fields.

It is more fundamental and often more useful, to obtain images without modulating the magnetic state. The background can be removed with image subtraction if the images of the same state are made negatives of each other. This approach was used very early, historically; when positive and negative photographic film were exposed and superimposed to remove background. Subtracting video images electronically, also doubles contrast while removing background. The expression (1) for Kerr-effects shows the image contrast inverts to a negative of itself if the sign of one of the parameters of the optical setup is reversed. Then repeating the sequence of video detection, A/D conversion, and subtraction of negative image pairs, should render a suitable M-sensitive image. Sign reversal for any one of the following parameters will invert the Kerr component of contrast: reversal of angle-of-incidence, $\theta_0$, with respect to the surface normal; reversal of the incident light polarization, $\Psi_p$, with respect to $\Psi_p=0$ being parallel to the optical POI; and reversal of the analyzer angle, $\alpha_s$, with respect to $\alpha_s0$ being perpendicular to the optical POI.

Although difference images developed by reversing sign of one of these angles, can enhance contrast and remove background, practical limitations of the microscope are an issue. One is the limitation of the sheet polarizers in the microscope. Variations across sheet polarizers of the output polarization axis, called 'axis wander', range from 10–50 millidegrees. This type of distortion can appear in subtracted inverse images based on reversing polarizer offset angles, $\Psi_p$ or $\alpha_s$. Their magnitude is equal or much larger than permalloy's saturation rotation of order 10 millidegrees. Indeed, attempts to reverse offset angles with rotating an analyzer or polarizer, have rarely been reported successful, particularly when imaging with high magnification optics.

Our method to reverse Kerr contrast in-plane, is to reverse the incidence angle of illumination, $\vartheta_0$ (equivalent to changing the direction of light rays, or to interchanging rays of illumination and observation). Our unreported early attempts to move the Hg-arc source for this purpose, were thwarted possibly because of the large size and assymetry in its intensity distribution, and to imprecise motion control. Errors in arc displacement are amplified also, by steep increases in 'leakage' with distance from the extinction cross, and sometimes by the loss of 4-fold symmetry in the 'cross' when the object surface is not entirely orthogonal to the optic axis. To rely on source movement for reversing sign of $\vartheta_0$, the source and its movement must have very special properties: before and after displacement, it must have equivalent symmetric light distributions and its displacement must be to opposite symmetric locations on opposite arms of the extinction cross.

Figure 8:
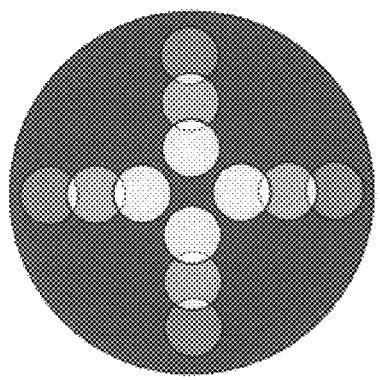
FIG. 8. Illustration of an alternative 'quadrate' source comprising multiple images transformed from a bright fiber output face by a holographic grating.

Two methods are at our disposal to satisfy equivalent, symmetric illuminations from opposite oblique angles of incidence. One method translates the image of the source by means of optical refraction; another displays multiple images of the source by means of optical diffraction. A refraction method to produce the quadrate is illustrated in FIG. 7, while the diffraction method is illustrated in FIG. 8. For each method, we modify our laser-illuminated /fiber method of forming a spot source in a manner that provides a 'quadrate' source having equal intensity distributions (speckle-free) at each of its four lobes, and we provide a set of apertures (FIG. 9) to isolate specific lobes. The lobes are aligned, once during initial setup, to be coincident with the microscope's "cross of extinction". Once set up, the quadrate source can be used many times for generalized imaging of three M-vector components, as explained below.

FIG. 7. Shows four positions of a rotating glass disk wedge (GDW) and the corresponding positions of source spots of illumination in the objective RFP. Bright spots which are images of the output face of the laser illuminated fiber, are refracted off axis by the GDW. Rotating the GDW circulates the source as indicated to the right and evidenced in the time-averaged trace shown in FIG. 10. Symmetry, stability and repeatability of a dithered spot source or apertured ring source, avoids image distortion and errors in image subtraction.

FIG. 8. shows an illustration of an alternative 'quadrate' source: multiple images transformed from a bright fiber output face by a holographic grating.

Figure 9:
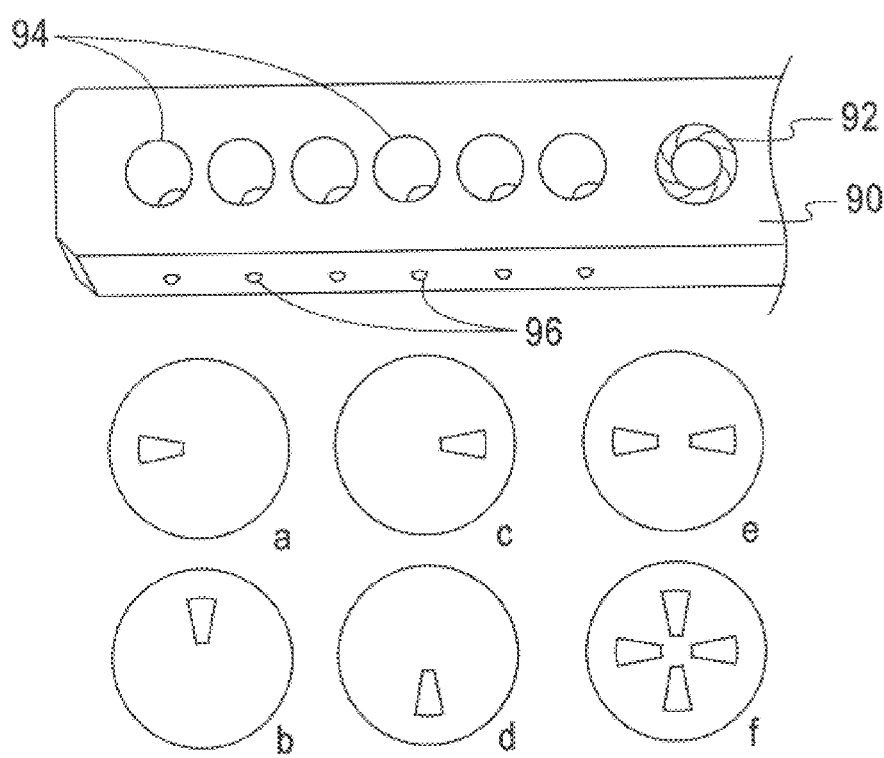
FIGS. 9a–f. Microscope aperture slider modified to produce 'quadrate illumination'.

FIGS. 9. shows a microscope aperture slider 90 modified to produce 'quadrate illumination', which replaces the original slider having an adjustable iris 92. The single-hole apertures, a–d, in produce oblique illumination giving longitudinal (in-plane) plus polar (perpendicular) Kerr sensitivity plus background. Symmetric double-hole, e and 4-hole, f, apertures produce polar Kerr contrast plus background.

Figure 10:
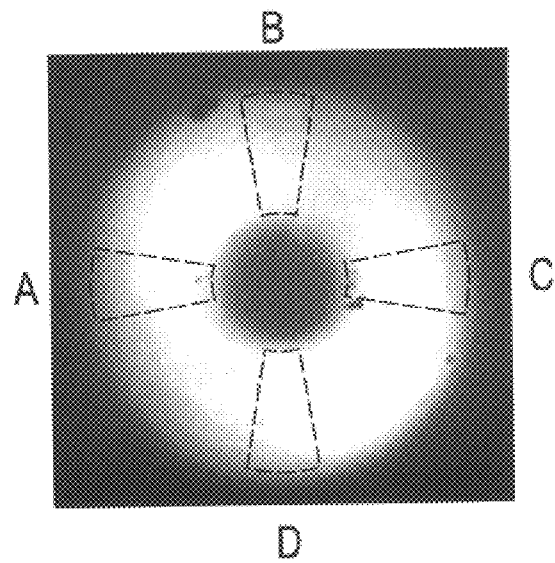
FIG. 10. Photograph of 'ring' source (in conoscopic view) due to time-averaged motion.

Method 1 produces a 'ring shaped' source instead of a "spot" focused in the objective RFP. The ring source combined with four apertures provides the quadrate. The apertures are a–f of FIG. 9 are selected as necessary to produce different Kerr sensitivities depending on polarization and angle of incidence. FIG. 10 shows a 'ring' 100 obtained experimentally as a time-averaged conoscopic view detected with video. Dashed lines 102 illustrate quadrate aperture locations a–e corresponding to the apertures in FIG. 9. The shape of a ring was produced by passing the collected beam of fiber-output light through the outer region of a rotating glass wedged disk, as illustrated in FIG. 2. In order to produce the 'ring' instead of the 'spot' of FIG. 3c, another wedge having a larger wedge angle, is inserted. An increased wedge angle causes increased displacement in the RFP. When the wedge is not rotating, beam refraction produces one spot on the ring. Wedge rotation faster than video rate, makes the spot rotate and the ring appear steady. (Simply using stepped motions of the wedge, A to B to C to D, etc., is also useful. However, 'speckle' may increase unless some means such as another rotating wedge dithers the spot image over a few fiber mode spacings.)

Figure 1:
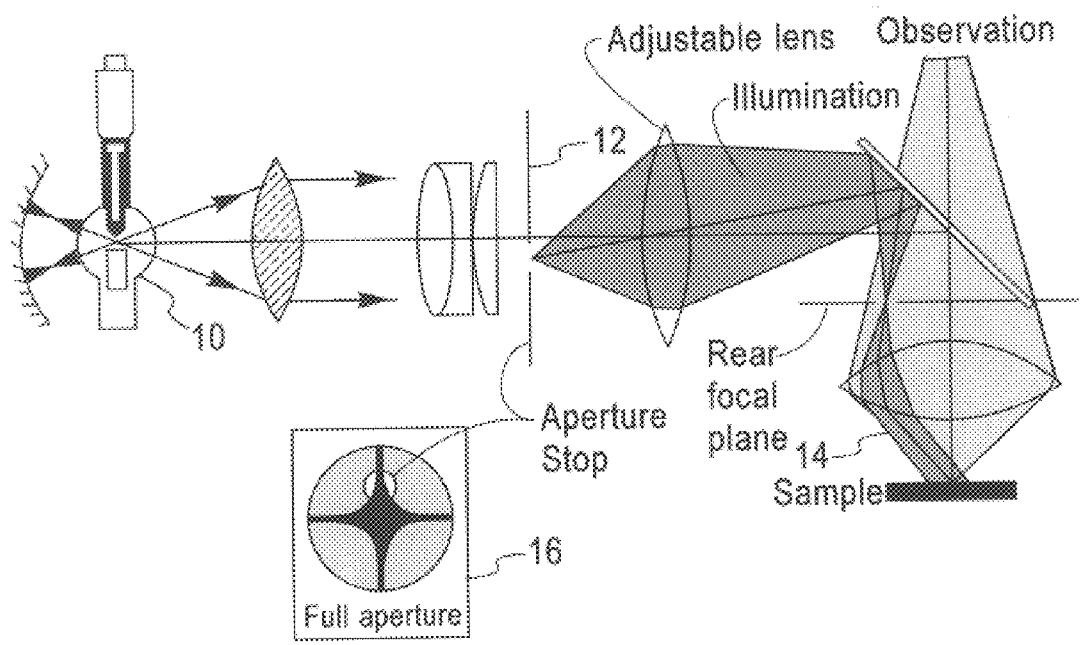
FIG. 1 Prior art view of conventional wide-field microscope using large Hg-arc source.

Apertures exposing the 4-fold lobes, make the ring source a 'quadrate' source. The dashed lines in FIG. 10 indicate aperture size and location on the ring. Each open aperture provides oblique wide-field illumination on the magnetic object. Combinations of two apertures symmetric about the center, produce symmetric illumination at normal incidence (on average) to the sample in the object plane. Switching among apertures is simplified by the use of a modified microscope slider. We start with the slider 90 containing the adjustable iris 92 used for normal control of conventional illumination, and machine bottoming holes 94 to receive the apertures as required for the different Kerr sensitivities. FIG. 9 illustrates hole positions and alignment stops 96. Cups having apertures at the bottom of types shown in FIGS. 9(a–f), are machined precisely to have equivalent shape and size, and are placed in the holes 94 of the slider 90. Optically, the apertures are imaged in an intermediate focal plane that is conjugate to the rear focal plane of the objective (not shown in FIG. 1). Pre-alignment capability allows superimposing aperture images onto the illumination 'ring' of FIG. 10. Aperture selection is made by translation among the small steel balls 96 imbedded as stops on the slider's bottom edge. In this design for example, switching among apertures in FIG. 9, say "a" at 9 o'clock to "c" at 3 o'clock, effectively reverses the sign of the angle of illumination $\vartheta_0$ without changing the intensity distribution. Subtracting images for the aperture pair "a"–"c" develops X-axis longitudinal-Kerr (only) sensitivity, and the pair "b"–"d" develops the Y-sensitivity.

In Method 2, a non-rotating holographic diffraction grating is inserted in the optical path. The optical diffraction plates were created with holographic methods of computerized design supplied by MEMS, Inc. They may have many forms. One form produces light diffraction in circular patterns, another along a line, another along two lines orthogonal to each other. Ours was the latter, chosen to produce three displaced images (1st, 2nd, and 3rd-order diffracted images) of the fiber face into the four lobes within the objective pupil. A diffracted pattern appears in conoscopic view at the objective's rear focal plane, as illustrated in FIG. 8. Pattern formation onto orthogonal lines produces the desired 'quadrate'. Illumination from aperture-selected spots, or a combination of rows of spots as needed, produces the desired longitudinal Kerr-sensitive axes. In order to develop polar Kerr contrast with signal strengths that are calibrated with respect to in-plane components, the polar signals first have to be obtained using a symmetric aperture pair (cup "e") or two symmetric pairs (as in cup "f") shown in FIG. 9. These polar signals must then be normalized according to the increased source areas and corrected for their fall-off with angle of incidence proportional to cos $\vartheta_0$. The polar mode must however, develop a pair of negative images without changing the magnetic state of the sample. Only then, with image subtraction, is it possible to map the sample's $M_z$-components without changing the sample's magnetic state.

Combining the quadrate method with a method to be defined below for producing polar-Kerr contrast devoid of background, produces difference images devoid of background and lead to a capability for mapping each of the three magnetization components. The method is not limited to magnetically 'soft' materials. Previous methods were capable of mapping $M_z$, or $M_x$ and/or $M_y$, but not all three together. They were also limited largely to magnetically 'soft' materials. Our new method removes background reflections unrelated to the magnetization and enhances (by at least twice) the ordinary Kerr contrast. Image contrast having Kerr sensitivity to $M_{in-plane}$ and $M_{perpendicular}$ are produced by suitable aperture selections and image subtraction. This is done directly (without modulating the sample). Hence, images can be computed and colorized to well represent M-vector orientations and their time evolution.

As in previous methods, orthogonal X and Y components in-plane are determined separately, one from images taken with the POI aligned parallel to one axis of the microscope, and the other from images formed when the POI is aligned orthogonal to this axis. Alignment of the POI with the microscope's bi-axes is necessary. The bi-axes are defined by orientation of a beam splitter which provides for epi-illumination, a condition in which light illuminates reflecting samples with rays directed though the objective lens. Our method for rotating the POI is much simpler and less cumbersome than displacing an arc-source. However, opening the apertures one-at-time, mixes polar Kerr contrast with the longitudinal Kerr contrast. We show below how image algebraics can be used to separate 'polar' and 'longitudinal' sensitivity.

We use s-polarized illumination ($\Psi_p=90°$) for pure in-plane sensitivity- in order to avoid any residual transverse Kerr contrast—and write down contributions from longitudinal and-polar Kerr signals for apertures 'A' and 'C' (referring to labels in FIG. 10). The longitudinal Kerr contrast intensities from opposing apertures, A and C, are taken to be negatives of each other. We assume background distributions $I_b$ from all apertures A–D are the same, as are also the polar Kerr contributions. Therefore, image intensities from A and C are $$I(A)=I_{longitudinal}(A)+I_{polar}(A)+I_b \quad (2)$$

$$I(C) = I_{longitudinal}(C) + I_{polar}(C) + I_b \quad (3)$$

$$= -I_{longitudinal}(A) + I_{polar}(A) + I_b$$

Adding and subtracting images (2) and (3), gives:

$$I(A)+I(C)=2I_{polar}(A)+I_b \quad (4)$$

$$I(A)-I(C)=2I_{longitudinal}(A) \quad (5)$$

The combination (5) generates pure in-plane magnetization-sensitive contrast parallel to A–C (along the x-direction, in the sample).

Similarly, in order to provide pure in-plane sensitivity in the B–D direction (along y), A and C apertures are blocked, and image subtraction applied using apertures B and D. The result similar in form to (5), is $$I(B)-I(D)=2I_{longitudinal}(B) \quad (6)$$

This method removes polar sensitivity from wide-field illumination, and it does not require modulating or saturating sample magnetization, as was necessary with our previous methods.

To obtain polar Kerr sensitivity to $M_z$ (Z-axis sensitivity) and its calibration relative to longitudinal signals above, it is necessary to use apertures with the same shape and area as above, and maintain the same angle of illumination obtained as above. However, the aperture pair for polar sensitivity must have symmetry about the optic axis in order to avoid in-plane Kerr sensitivity. The two lobes (or four) must lie symmetrically opposite the center. The net effect is then to produce pure Z-sensitivity via the polar Kerr-effect. Aperture cup 'e' (or 'f') of FIG. 9 with 2 (or 4) such holes is selected. The approach for subtracting background must be changed however, as can be seen theoretically by evaluating intensity differences among domains having + and − polar components (up and down domains). From squaring the light field amplitudes in (1) and incorporating a nonmagnetic background intensity, $I_b$, the total intensity becomes $$I_2-I_1+I_b=2 \sin(2\alpha_s)A_K A_N+I_b. \quad (7)$$

In order to subtract out $I_b$, two images can be formed in memory and subtracted, one each for opposite signs of offset angle, $\alpha_s$. Rotating a sheet analyzer to reverse $\alpha_s$, is not helpful due to the ranges of defect variations discussed above. Contrast inversion is possible however, by inserting a Faraday rotation modulator [FR] in the optical path to reverse the sign of an 'effective' as produced with a FR while microscope polarizers are crossed. FR properties required are: (1), that it is controllable with an external field, sufficiently so as to change polarization of reflected or incident light by exactly equal but opposite amounts; (2), that the FR magnetic field be prevented from straying to the region of the object, disturbing its magnetic state, and (3) that insertion of a FR device into the microscope not alter its imaging properties.

To satisfy requirement #2 the FR element must (a) be located far from the sample object, (b) or be magnetically shielded from the object, or else (c) the FR must be efficient so that minimal field is necessary to produce the FR rotation.

Figure 11:
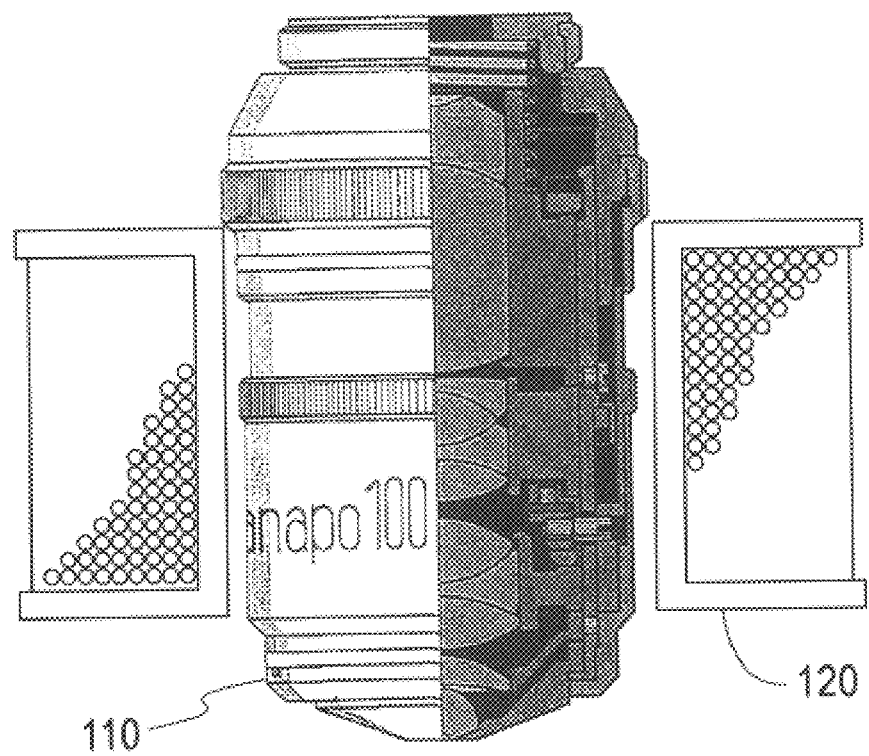
FIG. 11. Apparatus for Faraday rotation method to change sign of $\alpha_s$.

To satisfy requirement #1 the FR response to an applied field must be linear and not hysteretic. Thus, the FR material ought to be diamagnetic or paramagnetic. However, such materials typically have very small Verdet constants (ratio of Faraday rotation per unit thickness divided by strength of applied field). In order to provide large FR efficiency and satisfy requirement #3, the FR material must be very thick. Adding a thick optical element into a microscope however, will alter its imaging capability. We use a lens existing within the microscope itself; its glass is diamagnetic. Because the microscope objective 110 protrudes from the microscope, it can be enclosed with a current carrying coil 120 as sketched in FIG. 11. The better objectives tend to contain thicker optics, so they tend to produce larger Faraday rotations and thus satisfy requirement 2(c) better. The Faraday rotation method changes the sign of $\alpha_s$ as the current in the coil around the microscope objective is reversed, and produces negative image pairs when microscope polarizers are crossed. Subtracting the two images eliminates background and enhances the pure polar Kerr contrast occurring when apertures e or f in FIG. 9b are applied. The coil field works when the microscope polarizers are crossed and offsets the polarization (from extinction) by producing pure Faraday-effect rotation of light inside the objective's glass.

Figure 12:
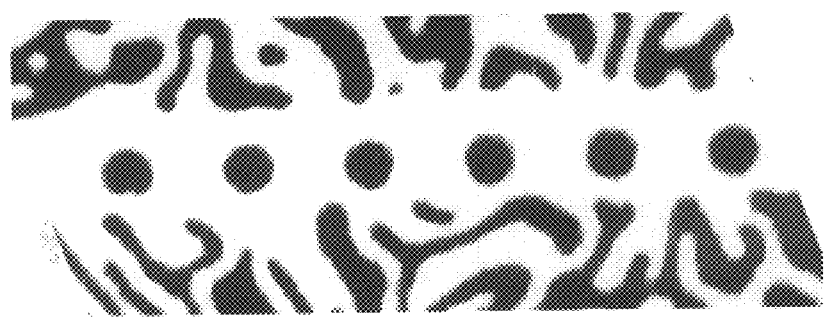
FIG. 12. Pure polar Kerr-effect contrast in a magneto-optic media film.

FIG. 12 shows stark black and white (background-subtracted) contrast and delineates magnetic domains in a magneto-optic media film having perpendicular anisotropy, a material useful as medium for magneto-optic memories. This image of up and down domains was obtained by accumulating and then subtracting two images, one each for opposite currents in the lens coil of FIG. 11. Image scale is indicated by a 2.5 $\mu$m separation between centers of the circular domains which were thermally nucleated on a line using a pulsed infrared laser.

An extension of the above idea is to use a magnetic garnet film with a current carrying coil and a current reversing means to reverse the polarization offset angle. It is well known that certain types of thin magnetic garnet films can be formed which exhibit a strong and spatially uniform Faraday Rotation which is also highly linear with respect to the small impressed magnetic field. Such a film and magnetic coil may be introduced into the microscope into one of several possible positions where the optical rays are mainly parallel. Applying a small magnetic field to the film, taking an image, reversing direction of the field, taking another image, and subtracting the images one from the other would determine the polar component of the magnetization of the sample.

FIG. 13 a is high resolution example of pure polar Kerr contrast taken at the pole tips of a MR recording head recently shipped in a server class drive. The line scan of FIG. 13b is averaged over 1/3rd of tip width. The illumination passed through aperture set "e" in FIG. 9 and also through 10 nm of gold covering the surface. Dimensions (measured with an SEM) are 0.9 $\mu$m P2 tip width, 2.6 $\mu$m P2 length, and the gap separating P2 and P1 is 0.25 $\mu$m. This colorized mapping and the line scan FIG. 13b, show the distribution of the perpendicular component of magnetization in the poles. The two figures scale together horizontally. A DC current amplitude sufficient to write bits in a high density medium was applied and reversed and images correspondingly subtracted. Note that this type of object is one of rare instances when both an internal current-reversal method and the Faraday-rotator method can be used to form the image. This equivalence will not occur however, when lower currents are applied as will be required in order to investigate fundamentally the processes of M-rotation from in-plane to out-of-plane orientations. Even though a current being applied (amplitude sufficient to 'write' a bit) forces most of the magnetization to lie perpendicular to tip surfaces, residual in-plane components may yet be present. This is indeed the case as shown with high sensitivity in FIG. 14a–b where two orthogonal components {Y in FIG. 14a and X in FIG. 14b of pure in-plane Kerr sensitive responses are obtained in the same recording head and for the same applied saturating current.

FIGS. 14a–b shows pure in-plane magnetic sensitivity perpendicular (FIG. 14a)—and parallel (FIG. 14b) to tip axis with saturating current applied to head of FIG. 13. FIG. 14a is the difference of inverse contrast image pair formed when apertures "c" and "d" of FIG. 9 were applied to the quadrate source of FIG. 8. In FIG. 14b, apertures "a" and "b" were applied.

These results reveal several underlying aspects: (1) an indication that the P2 (long) tip is constructed of two different magnetic layers, one likely containing a high magnetic moment alloy next to the gap and a moderate magnetic moment layer such as permalloy, at the region in P2 far left of the gap; (2) a specific location for the connection (at 8.5 $\mu$m) of the two long magnetic pole tip layers used for shielding a magnetoresistive sensor. (The sensor is suboptical in thickness and therefore not visible.) Note the drop in polar Kerr contrast at the borders, also the valley in Kerr contrast at the middle of P2 in line scan (b). This behavior is believed to be due to the magnetic moment difference of the two different alloys.

We have described a unique method to significantly improve the type of well-known and convenient Kerr microscopy which utilizes wide-field illumination, video detection, and digital image processing. The method enables decomposing the various Kerr contrasts to map all three magnetization components in a magnetic surface. It is necessary to collect five images; but six is more practical (two for each component). Calibration for relative component strengths is made possible by illumination from a unique 'quadrate' source having four lobes with equivalent intensity distributions. Transformation from the 'spot source' imaged in the rear focal plane of the objective, into the 'quadrate source', is accomplished using either a diffracting or refracting element. During a setup procedure, the four lobes of the quadrate are aligned with the polarizing microscope's 4-fold cross of extinction. Image contrast sensitive only to $M_x$, $M_y$, or $M_z$, is produced by subtracting Kerr-contrast images obtained using illumination from a specific pair of quadrate lobes. In-plane, $M_x$-sensitive contrast (devoid of polar-Kerr and background signals) is produced by blocking Y-axis lobes and subtracting images (negatives of each other) produced when each of the X-axis pair of lobes are exposed. Pure in-plane, $M_y$-sensitive contrast results similarly, from an image subtraction when each of two Y-lobes are exposed. $M_z$-sensitivity (devoid of in-plane sensitivity) obtains when both lobes in one or both arms of the quadrate are exposed. Background signals still present, are removable by subtracting images—negatives of each other—produced starting with crossed microscope polarizers. The polar-Kerr contrast (and its reversal), are possible with a polarization-offset induced by applying (and reversing) an axial field to the objective lens. The field is conveniently supplied by a coil surrounding the objective lens. Reversing the field reverses the offset and inverts the polar Kerr contrast without altering background. A refraction method based on a rotating glass wedge, can produce stationary images. Separating polar sensitivity from oblique incidence Kerr contrast is exemplified in two pure in-plane sensitive images of pole tips in a recording head. The in-plane response is present even when a current applied to the integrated coil, nearly saturates the tip magnetization and producing mostly polar Kerr contrast.

Obviously, many modifications and variations of the present invention are possible in light of the above teachings. It is therefore to be understood that, within the scope of the appended claims, the invention may be practiced otherwise than as specifically described. US patents, patent applications, provisional patent applications, and references cited above, including the references cited therein, are hereby included by reference.

We claim:

1. A method for measuring at least one of three independent spatially resolved components of magnetization of material on the surface of an object, comprising;
    a) simultaneously and substantially uniformly illuminating a field of view on the surface of the object with an $n^{th}$ set of light rays from an optical system, the light rays incident on to the surface at an approximate angle $\vartheta_0$ to the normal to the surface of the object, the incident light rays having an $n^{th}$ plane of incidence with respect to the surface and an $n^{th}$ polarization with respect to the $n^{th}$ plane of incidence, the incident light rays having an $n^{th}$ angle with respect to a coordinate system of the optical system; and then
    b) constructing at least one image of the surface from light from the $n^{th}$ set of incident light rays which are reflected and scattered from the surface, wherein each image has resolution elements less than 1 micron in diameter and where the field of view contains more than 1,000 resolution elements; and then
    c) repeating steps a) and b) to construct at least two images for at least a first and a second different sets of light rays, wherein the magnetic field at the surface of the object is not changed and the relative positions of the object and the optical system is not changed; and then
    d) calculating at least one of the three independent spatially resolved magnetic components from the at least two images.

2. The method of claim 1, wherein steps a) and b) are repeated to construct at least four images for at least four different sets of light rays wherein step d) comprises;
    d) calculating at least two of the three independent spatially resolved magnetic components from the at least four images.

3. The method of claim 2, wherein steps a) and b) are repeated to construct at least six different images for at least four different sets of light rays of the illuminating light rays wherein step d comprises;
    d) calculating the three independent spatially resolved magnetic components from the at least six images.

4. The method of claim 1, wherein the steps of illuminating comprise:
    directing a laser beam into the entrance aperture of a beam homogenizer;
    imaging the exit aperture of the beam homogenizer on to the surface, and,
    dithering the image of the exit aperture in a direction having a component parallel to the surface.

5. The method of claim 4, where the beam homogenizer is a light tunnel.

6. The method of claim 4, where the beam homogenizer is a light pipe.

7. The method of claim 4, where the beam homogenizer is an optical fiber.

8. The method of claim 7, where the optical fiber suffers a time varying strain.

9. The method of claim 4, where the dither means is a rotatable wedge.

10. The method of claim 4, where the dither means is a electro-optic device.

11. The method of claim 4, where the dither means is a magneto-optic device.

12. The method of claim 4, where the dither means is a rotatable lens section.

13. The method of claim 4, where the dither means is an acousto-optic device.

14. The method of claim 1, wherein the sets of light rays are produced by a hologram.

15. The method of claim 1, wherein the sets of light rays are produced by rotating the image of the exit aperture of a light tunnel.

16. A method for measuring at least one of three independent spatially resolved components of magnetization of material on the surface of an object, comprising;
    a) inserting the object into a high magnification polarizing microscope, wherein the surface of the object is in the focal plane of the microscope; and then
    b) simultaneously and substantially uniformly illuminating the surface with a set of parallel light rays passing through an $n^{th}$ extended off axis portion of the back focal plane of the microscope;
    c) constructing an $n^{th}$ image of the surface from light from set of light rays passing through an $n^{th}$ extended off axis portion of the back focal plane of the microscope, the $n^{th}$ image having a resolution elements less than 1 micron in diameter and a field of view if more than 1,000 resolution elements; and then
    d) repeating steps c) and d) for n=at least 1 and 2 to construct at least 2 images for at least 2 different sets of light rays passing through at least 2 extended off axis portions of the back focal plane (BFP) of the microscope, wherein the magnetic field at the surface of the object is not changed and the relative positions of the object and the optical system is not changed; and then
    e) calculating at least one of the spatially resolved independent magnetic components from the at least two images.

17. The method of claim 16, wherein steps b) and c) are repeated to construct at least four images for at least four different extended off axis portions of the BFP, wherein step d) comprises;
    d) calculating at least two of the spatially resolved independent magnetic components from the at least four images.

18. The method of claim 17, wherein steps a) and b) are repeated to construct at least six different images for at least four different portions of the BFP and at least two different polarizations of the illuminating light rays wherein step d comprises;
    d) calculating the three independent spatially resolved magnetic components from the at least six images.

19. The method of claim 16, wherein the steps of illuminating comprise:
    directing a laser beam into the entrance aperture of a beam homogenizer;
    imaging the exit aperture of the beam homogenizer on to the surface, and;
    dithering the image of the exit aperture in a direction having a component parallel to the surface.

20. The apparatus of claim 19, where the beam homogenizer is a light tunnel.

21. The apparatus of claim 19, where the beam homogenizer is a light pipe.

22. The method of claim 19, where the beam homogenizer is an optical fiber.

23. The apparatus of claim 22, where the optical fiber suffers a time varying strain.

24. The method of claim 19, where the dither means is a rotatable wedge.

25. The method of claim 19, where the dither means is a electro-optic device.

26. The method of claim 19, where the dither means is a magneto-optic device.

27. The method of claim 19, where the dither means is an acousto-optic device.

28. The method of claim 19, where the dither means is a rotatable lens section.

29. The method of claim 16, wherein the sets of light rays are produced by a hologram.

30. The method of claim 16, wherein the sets of light rays are produced by rotating the image of the exit aperture of a light tunnel on to the BFP of the microscope.

31. A method for measuring spatially resolved components of magnetization of material on the surface of an object, comprising;
 a) illuminating the surface of the object with at least 4 different sets of light rays from an optical system; and then
 b) constructing at least six different images of the surface of the object from the light reflected from the object; and then
 c) calculating three independent spatially resolved components of magnetization of the material on the surface of the object from the at least six images, wherein the magnetic field at the surface of the object is not changed and the relative positions of the object and the optical system is not changed, and wherein each image has resolution elements less than 1 micron in diameter and a field of view if more than 1,000 resolution elements.

32. A method for measuring spatially resolved components of magnetization of material on the surface of an object, comprising;
 a) illuminating the surface of the object with at least 4 different sets of light rays from an optical system; and then
 b) constructing at least four different images of the surface of the object from the light reflected from the object; and then
 c) calculating two independent spatially resolved components of magnetization of the material on the surface of the object from the at least four images, wherein the magnetic field at the surface of the object is not changed and the relative positions of the object and the optical system is not changed, and wherein each image has resolution elements less than 1 micron in diameter and a field of view if more than 1,000 resolution elements.

33. A method for measuring spatially resolved components of magnetization of material on the surface of an object, comprising;
 a) directing a laser beam into the entrance aperture of an optical fiber;
 b) imaging the exit aperture of the optical fiber on to the surface;
 c) dithering the image of the exit aperture in a direction having a component parallel to the surface;
 d) constructing an image of the surface of the object from light reflected from the object;
 e) repeating steps a–d to construct at least 6 different images from at least 4 different conditions of imaging the exit aperture; and
 f) calculating three independent spatially resolved components of magnetization of the material on the surface of the object from the at least six images, wherein the magnetic field at the surface of the object is not changed and the relative positions of the object and the optical system is not changed, and wherein each image has resolution elements less than 1 micron in diameter and a field of view if more than 1,000 resolution elements.

34. A method for measuring spatially resolved components of magnetization of material on the surface of an object, comprising;
 a) directing a laser beam into the entrance aperture of an optical fiber;
 b) imaging the exit aperture of the optical fiber on to the surface;
 c) dithering the image of the exit aperture in a direction having a component parallel to the surface;
 d) constructing an image of the surface of the object from light reflected from the object;
 e) repeating steps a–d to construct at least 6 different images from at least 4 different conditions of imaging the exit aperture; and
 f) calculating three independent spatially resolved components of magnetization of the material on the surface of the object from the at least six images, wherein the magnetic field at the surface of the object is not changed and the relative positions of the object and the optical system is not changed, and wherein each image has resolution elements less than 1 micron in diameter and a field of view if more than 1,000 resolution elements.

35. A method for measuring spatially resolved components of magnetization of material on the surface of an object, comprising;
 a) directing a laser beam into the entrance aperture of an optical fiber;
 b) imaging the exit aperture of the optical fiber on to the surface;
 c) dithering the image of the exit aperture in a direction having a component parallel to the surface;
 d) constructing an image of the surface of the object from light reflected from the object;
 e) repeating steps a–d to construct at least 4 different images from at least 4 different conditions of imaging the exit aperture; and
 f) calculating two independent spatially resolved components of magnetization of the material on the surface of the object from the at least six images, wherein the magnetic field at the surface of the object is not changed and the relative positions of the object and the optical system is not changed, and wherein each image has resolution elements less than 1 micron in diameter and a field of view if more than 1,000 resolution elements.

36. A method for measuring spatially resolved components of magnetization of material on the surface of an object, comprising;
 a) directing a laser beam into the entrance aperture of an optical fiber;

b) passing light from the the exit aperture of the optical fiber through a hologram;

c) imaging the light passed through the hologram onto the surface;

d) dithering the image of the exit aperture in a direction having a component parallel to the surface;

e) constructing an image of the surface of the object from light reflected from the object;

f) repeating steps a–e to construct at least 6 different images from at least 4 different conditions of imaging the exit aperture; and g) calculating three independent spatially resolved components of magnetization of the material on the surface of the object from the at least six images, wherein the magnetic field at the surface of the object is not changed and the relative positions of the object and the optical system is not changed, and wherein each image has resolution elements less than 1 micron in diameter and a field of view if more than 1,000 resolution elements.

* * * * *